United States Patent
Kang

(10) Patent No.: US 8,154,929 B2
(45) Date of Patent: Apr. 10, 2012

(54) FLASH MEMORY DEVICE CONTROLLING COMMON SOURCE LINE VOLTAGE, PROGRAM-VERIFY METHOD, AND MEMORY SYSTEM

(75) Inventor: Sang-Gu Kang, Suwon-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 393 days.

(21) Appl. No.: 12/481,630

(22) Filed: Jun. 10, 2009

(65) Prior Publication Data

US 2010/0002508 A1    Jan. 7, 2010

(30) Foreign Application Priority Data

Jul. 4, 2008 (KR) .................. 10-2008-0065119

(51) Int. Cl.
*G11C 11/34* (2006.01)
(52) U.S. Cl. .................. 365/185.22; 365/185.09
(58) Field of Classification Search ............. 365/185.22, 365/185.09
See application file for complete search history.

(56) References Cited

U.S. PATENT DOCUMENTS

| | | | |
|---|---|---|---|
| 6,128,229 A | 10/2000 | Nobukata | |
| 7,352,623 B2 | 4/2008 | Kim et al. | |
| 7,376,016 B2 | 5/2008 | Kajimoto et al. | |
| 7,796,438 B2 * | 9/2010 | Kim et al. | 365/185.22 |
| 2008/0080241 A1 * | 4/2008 | Ho | 365/185.09 |

FOREIGN PATENT DOCUMENTS

| | | |
|---|---|---|
| JP | 2000276887 A | 10/2000 |
| JP | 2007026579 | 2/2007 |
| KR | 1020000023177 A | 4/2000 |
| KR | 1020070004295 A | 1/2007 |

* cited by examiner

*Primary Examiner* — Jason Lappas
(74) *Attorney, Agent, or Firm* — Volentine & Whitt, PLLC

(57) ABSTRACT

Disclosed is a flash memory device and a program-verify method. The flash memory device includes; a plurality of memory cells connected between a bit line and a common source line, and a data input/output circuit connected to the bit line and configured to store program data for a selected one of the plurality memory cells. The data input/output circuit maintains the program data during a program-verify operation and controls a voltage level on the bit line in accordance with the program data.

16 Claims, 12 Drawing Sheets

__US 8,154,929 B2__

FLASH MEMORY DEVICE CONTROLLING COMMON SOURCE LINE VOLTAGE, PROGRAM-VERIFY METHOD, AND MEMORY SYSTEM

CROSS-REFERENCE TO RELATED APPLICATIONS

This U.S. non-provisional patent application claims priority under 35 U.S.C. §119 to Korean Patent Application No. 10-2008-65119 filed on Jul. 4, 2008, the subject matter of which is hereby incorporated by reference.

BACKGROUND

The present invention relates generally to flash memory devices. More particularly, the invention relates to a flash memory device controlling a common source line (CSL) voltage and a program-verify method.

Semiconductor memory devices may generally be classified as volatile memories (e.g., DRAM and SRAM), and nonvolatile memories (e.g., EEPROM, FRAM, PRAM, and flash memory). Volatile memories lose stored data when applied power is interrupted, but nonvolatile memories retain stored data in the absence of applied power. Within the more general class of non-volatile memories, so-called flash memory enjoys a number of advantages including fast programming speed, low power consumption, large date storage capacity, etc. As a result, flash memory has been adopted for use in a wide range of consumer products requiring data storage.

Flash memory includes a memory cell array storing data. The memory cell array is typically divided or arranged into a plurality of memory blocks. Each memory block commonly include a plurality of data pages, and each page is formed from a plurality of memory cells. Binary (or single-level) memory cells (SLC) act as ON-cells or OFF-cells in relation to a present threshold voltage distribution selected between two possible voltage distribution states. (Multi-level memory cells (MLC) select between three or more possible voltage distribution states). On-cells are defined as memory cells having an erased state, while OFF-cells are programmed. Flash memory generally performs an erase operation on a memory block by memory block basis. In contrast, program and read operations are performed page by page.

Flash memory is configured in a cell string structure. The cell string includes a string selection transistor connected to a string selection line (SSL), memory cells connected to a corresponding plurality of word lines (e.g., WL0~WL31), and a ground selection transistor connected to a ground selection line (GSL). The string selection transistor is connected to a bit line (BL), and the ground selection transistor is connected to a common source line (CSL).

As noted above, flash memory may incorporate SLC and/or MLC memory cells. The proliferation of threshold voltage distributions required to store multi-level data creates increasingly narrow separation widths between adjacent threshold voltage distributions. In other words, discrimination or read margins are shrinking with an increasing number of possible threshold voltage distributions. It is therefore important to avoid spreading or broadening of one or more threshold voltage distributions.

In order to preserve defined separation widths between adjacent threshold voltage distributions, flash memory should avoid changing the voltage level apparent on the CSL during program-verify and read operations. That is, during the program-verify and read operations, the amount of current flowing through respective memory cells should not be different when said operations are executed in relation to memory cells programmed to the same data state.

However, within conventional flash memory it is quite common for the voltage apparent on the CSL to change due to certain parasitic capacitances associated with the CSL. This is unfortunate since variations in the CSL voltage during program-verify and read operations may cause broadening of one or more threshold voltage distributions for the memory cells.

SUMMARY

Embodiments of the invention preclude the foregoing problems and provide a flash memory device capable of reducing the difference in a CSL voltage between program-verify and read operations. Embodiments of the invention also provide a program-verify method for a flash memory device.

In one aspect of the present invention, a flash memory device is provided that includes; a plurality of memory cells connected between a bit line and a common source line, and a data input/output circuit connected to the bit line and configured to store program data for a selected one of the plurality memory cells. The data input/output circuit maintains the program data during a program-verify operation and controls a voltage level on the bit line in accordance with the program data.

In another aspect of the present invention, a program-verify method for a flash memory device is provided. The flash memory includes a plurality of memory cells connected between a bit line and a common source line, and a data input/output circuit connected to the bit line. The method includes; storing program data to be programmed in a selected memory cell in the plurality of memory cells in the data input/output circuit, and programming the program data to the selected memory cell and performing a program-verify operation, wherein the data input/output circuit maintains the program data during the program-verify operation, and controls a voltage level on the bit line in accordance with the program data.

In another aspect of the present invention, a memory system is disclosed and includes; a flash memory device, and a memory controller controlling the flash memory device. The flash memory device includes; a plurality of memory cells connected between a bit line and a common source line, and a data input/output circuit connected to the bit line and configured to store program data for a selected one of the plurality memory cells, wherein the data input/output circuit maintains the program data during a program-verify operation and controls a voltage level on the bit line in accordance with the program data.

BRIEF DESCRIPTION OF THE FIGURES

Non-limiting and non-exhaustive embodiments of the invention will be described with reference to the accompanying drawings, wherein like reference number and labels indicate like or similar parts, elements or features, unless otherwise specified. In the drawings.

DESCRIPTION OF EMBODIMENTS

Embodiments of the invention will now be described in some additional detail with reference to the accompanying drawings. The invention may, however, be embodied in different forms and should not be constructed as being limited to only the illustrated embodiments. Rather, the embodiments are presented as teaching examples.

Figure 1:
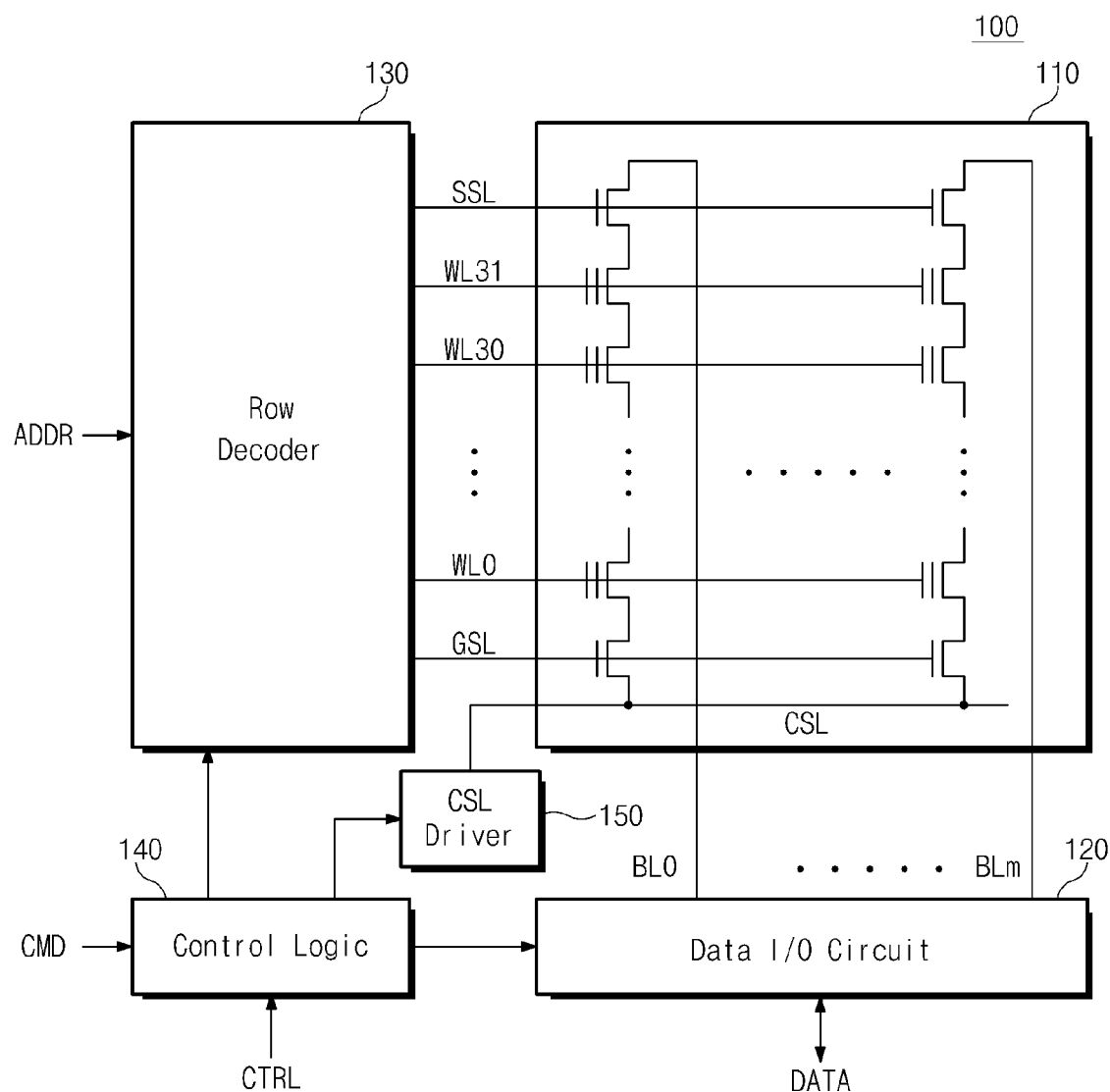
FIG. 1 is a block diagram of a flash memory device according to an embodiment of the invention.

Figure (FIG.) 1 is a block diagram of a flash memory device according to an embodiment of the invention. Referring to FIG. 1, the flash memory device 100 comprises; a memory cell array 110, a data input/output circuit 120, a row decoder 130, a control logic circuit 140, and a CSL driver 150.

The memory cell array 110 is logically defined and accessed, at least during erase operations, as a plurality of memory blocks. FIG. 1 shows a single unit memory block, representative of other memory blocks within memory array 110. Each memory block is further defined as a plurality of data pages. Each page is formed from a plurality of memory cells. Each memory cell may store a single bit of data (SLC) or multiple bits of data (MLC). The flash memory device 100 is assumed to perform erase operations on a memory block by memory block basis, and to perform program and read operations on a page by page basis.

Each memory block is formed of as a plurality of cell strings. Each cell string includes multiple memory cells (e.g., MC0~MC31) connected along a bit line BL. The bit line BL is connected to a common source line CSL via a ground selection transistor controlled by a ground selection line GSL.

Referring to FIG. 1, each cell string includes a string selection transistor connected to a string selection line SSL, the plural memory cells connected respectively to a plurality of word lines WL0~WL31, and the ground selection transistor connected to the ground selection line GSL. The string selection transistors are connected to respective bit lines BL0~BLm, with each ground selection transistor being connected to the common source line CSL.

Generally during a read operation, the flash memory device 100 applies a power source voltage (Vcc) to the string and ground selection lines SSL and GSL. A selected read voltage (Vrd) is applied to a selected word line (here, assumed to be WL0) and a deselected read voltage (Vread) is applied to unselected word lines (here, assumed to be WL1~WL31). The deselected read voltage (Vread) is a voltage sufficient to turn ON memory cells connected to the unselected word lines WL1~WL31.

The data input/output circuit 120 is connected to the memory cell array 110 via a plurality of bit lines BL0~BLm. The data input/output circuit 120 receives program data and exports read data (DATA) by way of a data input/output line (not shown). The data input/output circuit 120 temporarily holds program data in one or more of a plurality of memory cells. Program data held in the data input/output circuit 120 may be programmed to a corresponding memory cell in the memory cell array 110 during a program operation.

The data input/output circuit 120 also holds read data retrieved from the memory cell array 110 via a bit line BL. Read data may then be output to an external circuit via the data input/output line.

The data input/output circuit 120 holds program data during a program-verify operation, and controls the voltage level of one or more bit lines in accordance with corresponding value(s) for the program data. For instance, the data input/output circuit 120 controls a voltage level of the common source line CSL by discharging the bit line in relation to program data during a program-verify operation. In this manner, any variation in the amount of current flowing through the common source line CSL may be reduced, as between the read and program-verify operations. Exemplary circuitry and operating features related to the data input/output circuit 120 will be described in some additional detail with reference to FIG. 9.

Continued with FIG. 1, the row decoder 130 is connected to the memory cell array 110 via the plurality of word lines WL0~WL31. The row decoder 130 receives an address (ADDR) and selects a memory block or page. Here, a particular address selecting a specific memory block is referred to as "block address" and a particular address selecting a specific page is referred to as "page address."

The control logic circuit 140 generally controls the data input/output circuit 120, the row decoder 130, and the CSL driver 150 in response to commands (CMD) and control signal(s) (CTRL) received from external circuitry. Here, the control signal (CTRL) may be provided by a memory interface (see, e.g., element 210 in FIG. 11) or a memory controller (see, e.g., element 712 in FIG. 12). In certain embodiments of the invention, the control logic circuit 140 will generate bias voltages to be provided to the word lines during program, read, and erase operations.

During a read operation, the control logic circuit 140 generates the selected read voltage (Vrd) provided to the selected word line and the deselected read voltage (Vread) provided to unselected word lines. Generally, the deselected read voltage (Vread) is greater than the selected read voltage (Vrd). Exemplary circuitry and operational features associated with one embodiment of the invention for the CSL driver 150 will be described in some additional detail with reference to FIG. 2.

Figure 2:
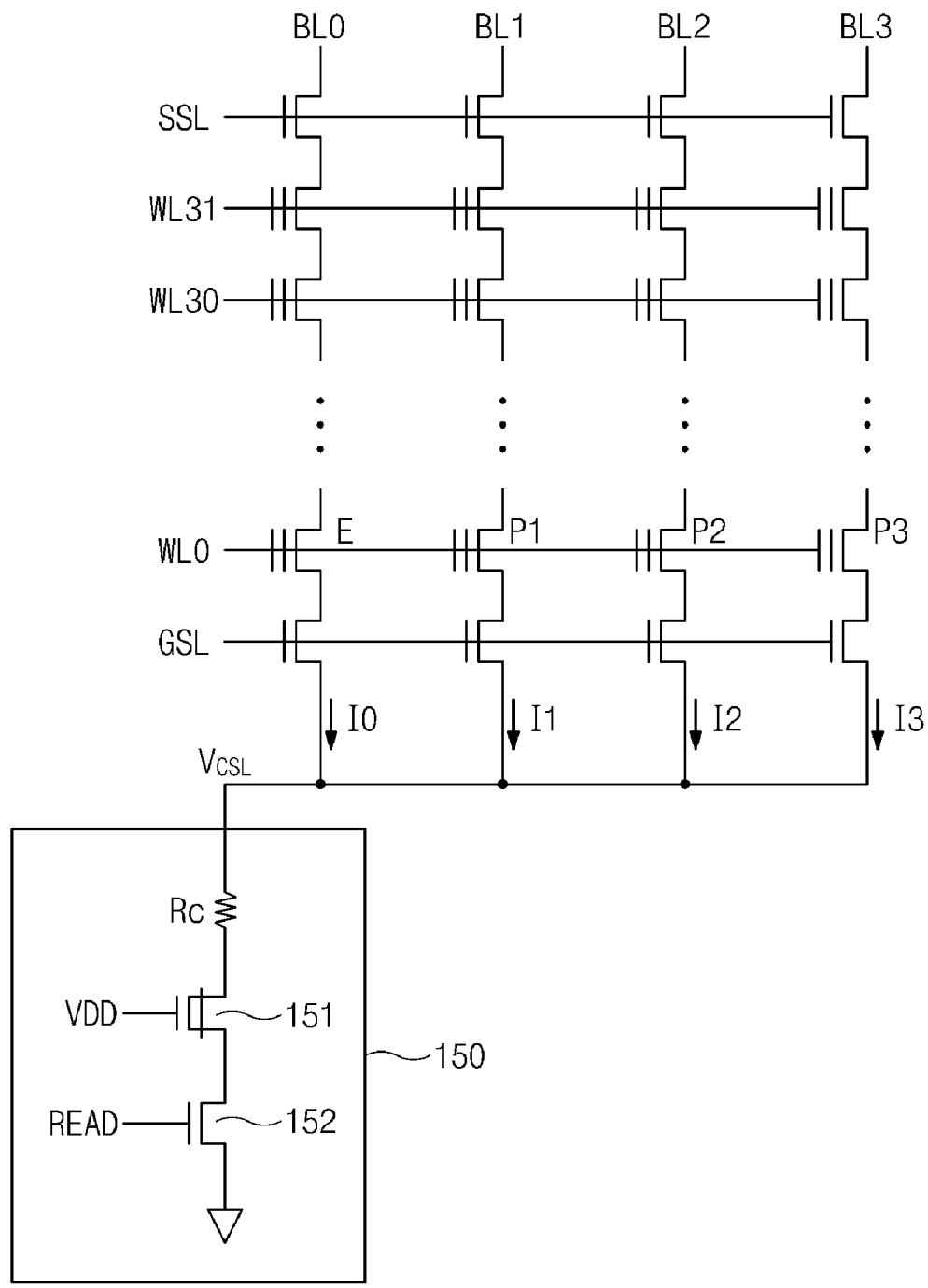
FIG. 2 is a circuit diagram further illustrating the CSL driver of FIG. 1.

FIG. 2 is a circuit diagram further illustrating the CSL driver of FIG. 1. Referring to FIG. 2, the CSL driver 150 comprises a metal-oxide-semiconductor (MOS) depletion transistor 151 and an NMOS transistor 152. Within FIG. 2, Rc denotes a parasitic resistance and/or capacitance (hereinafter, referred to as the "parasitic resistance") inherent in the common source line CSL. When electrical current flows through the common source line CSL, a CSL voltage $V_{CSL}$ will arise on (or be apparent on) the common source line CSL due to this parasitic resistance.

The respective channels of the transistors 151 and 152 within the CSL driver 150 are series connected between the common source line CSL and ground. The gate of the MOS depletion transistor 151 is coupled to the power source voltage VDD, and the gate of the NMOS transistor 152 is supplied with a control signal READ. Here, it is assumed that a read operation includes a program-verify operation as well as a normal read operation. The depletion MOS transistor 151 is provided to prevent the NMOS transistor 152 from being damaged should a high voltage be connected to the common source line CSL.

Referring to FIG. 2, the CSL driver 150 is connected to the plurality of cell strings. Each cell string is connected between the bit line BL and the common source line CSL. FIG. 2 shows only four (4) cell strings connected between the bit line BLi (i=0, 1, 2, 3) and the common source line CSL as a simple example.

In order to check for voltage variation on the common source line CSL in accordance with the number of ON-cells, two conditions are assumed. First, the memory cells connected to the selected word line WL0 are programmed to a state selected from a group of states including E, P1, P2, and P3, where E is an erase state and P1, P2, and P3 are respective program states. The memory cells programmed to (or conditioned) the P3 state have the highest threshold voltages. The memory cells conditioned in P1 and P2 states have threshold voltage successively intermediate between the E and P3 states. Second, the current flowing through each one of the four cell strings (i.e., I0, I1, I2, and I3) when the memory cells connected to the selected word line WL0 are ON-cells.

In accordance with these assumptions, the CSL voltage $V_{CSL}$ changes in relation to the number of ON-cells. For instance, if only memory cells having the E state are ON-cells and others memory cells are OFF-cells, then the CSL voltage $V_{CSL}$ becomes (I0×Rc). However, if memory cells having the E and P1 states are ON-cells, the CSL voltage $V_{CSL}$ becomes [(I0+I1)×Rc]. In similar vein, if the memory cells having the E, P1, and P2 states are ON-cells, the CSL voltage $V_{CSL}$ becomes [(I0+I1+I2)×Rc]. Thus, the CSL voltage $V_{CSL}$ will change as a function of the number and state of the ON-cells.

Figure 3:
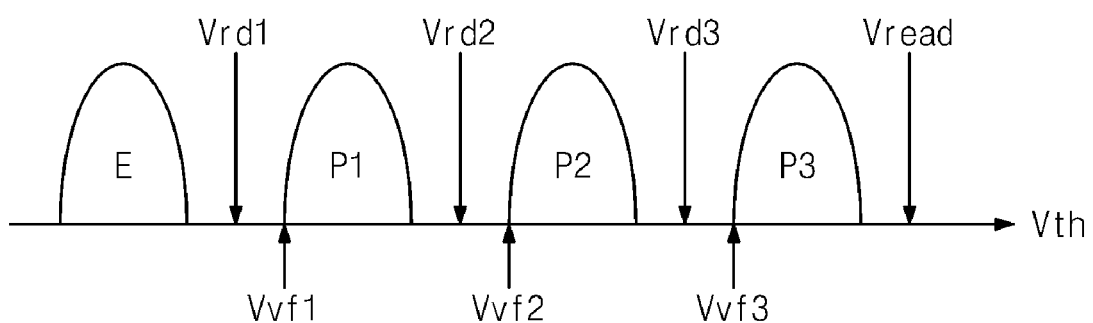
FIG. 3 is a graphic diagram showing exemplary threshold voltage distributions for the memory cells of FIG. 2.

FIG. 3 is a graphic diagram showing threshold voltage distributions for the memory cells of the selected word line shown in FIG. 2. Referring to FIG. 3, the memory cells are respectively conditioned in one of the four states E, P1, P2, and P3.

During the read operation, selected read voltages Vrd1, Vrd2, and Vrd3 are sequentially applied to the selected word line WL0, while the deselected read voltage Vread is applied to the unselected word lines WL1~WL31. The first deselected read voltage Vrd1 is defined between the erased state E and the first programmed state P1. The second deselected read voltage Vrd2 is defined between the first and second programmed states P1 and P2, and the third deselected read voltage Vrd3 is defined between the second and third programmed states P2 and P3.

If the first selected read voltage Vrd1 is applied to the selected word line WL0, the memory cells of the erased state E become ON-cells and the memory cells of the first through third programmed states P1, P2, and P3 become OFF-cells. If the second selected read voltage Vrd2 is applied to the selected word line WL0, the memory cells of the erased state E and the first programmed state P1 become ON-cells and the memory cells of the second and third programmed states P2 and P3 become OFF-cells. If the third selected read voltage Vrd3 is applied to the selected word line WL0, the memory cells of the erased state E and the first and second programmed states P1 and P2 become ON-cells and the memory cells of the third programmed states P3 become OFF-cells.

During the program-verify operation, program-verify voltages Vvf1, Vvf2, and Vvf3 are sequentially applied to the selected word line WL0. The first program-verify voltage Vvf1 is for programming memory cells into the first programmed state P1. The second program-verify voltage Vvf2 is for programming memory cells into the second programmed state P2, and the third program-verify voltage Vvf3 is for programming memory cells into the third programmed state P3.

FIGS. 4A, 4B, 5A, 5B, 6A, and 6B (4A through 6B) are diagrams showing threshold voltage distributions for various ON-cells when the program-verify and read voltages are applied to the selected word line. FIGS. 4A through 6B further illustrate changes in the number of ON-cells between the particular program-verify and read operations. As mentioned above in relation to FIG. 2, if there is a change in the number of ON-cells for memory cells connected to the selected word line, the CSL voltage $V_{CSL}$ will generally be different.

Figure 4A:
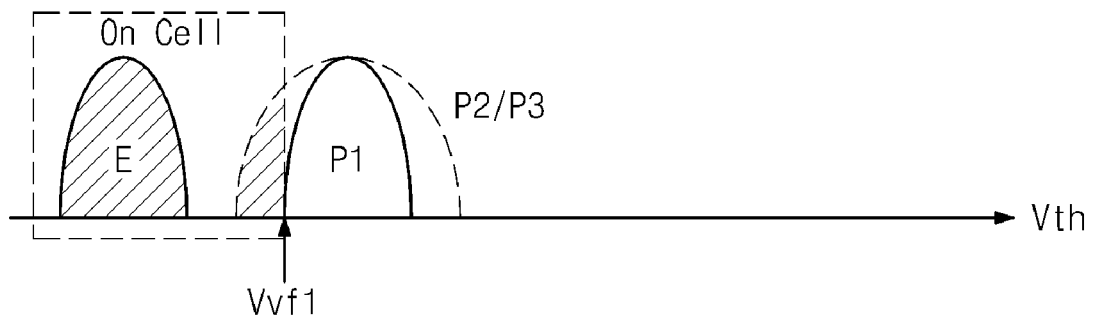
FIGS. 4A and 4B are diagrams showing exemplary threshold voltage distributions for program-verify and read operations related to a first programmed state.
Figure 4B:
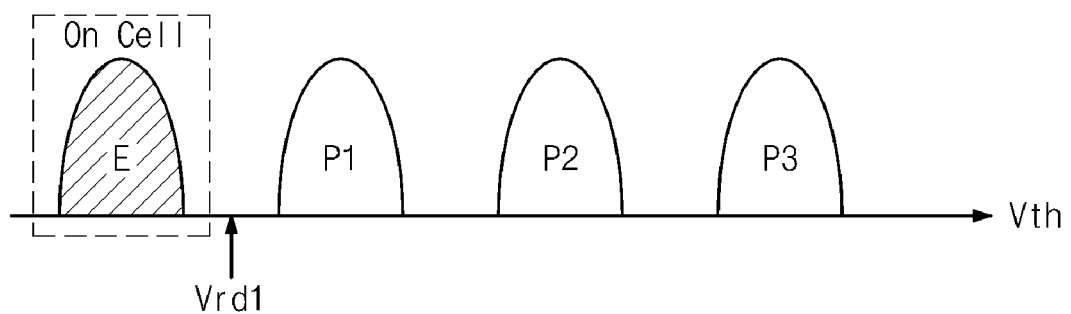

FIGS. 4A and 4B are diagrams showing threshold voltage distributions for the program-verify operation for programming the selected memory cells into the first programmed state P1, and threshold voltage distributions in the read operation for reading the selected memory cells of the first programmed state P1.

FIG. 4A shows threshold voltage distributions for ON-cells when the first program-verify voltage Vvf1 is applied to the selected word line. Referring to FIG. 4A, the ON-cells identified by the first program-verify voltage Vvf1 are illustrated in the hatched region of the drawing. In other words, the ON-cells corresponding to memory cells conditioned in the erased state E are shown with threshold voltages that have not yet reached the first program-verify voltage Vvf1, among the memory cells to be programmed to the second or third programmed states P2 or P3.

FIG. 4B shows threshold voltage distributions for ON-cells when the first read voltage Vrd1 is applied to the selected word line. Referring to FIG. 4B, the ON-cells identified by the first read voltage Vrd1 are illustrated in the hatched region of the drawing. That is, only the memory cells conditioned in the erased state E are ON-cells. As the normal read operation, different from the program-verify operation, begins after a programming operation, memory cells to be programmed to the second or third programmed state P2 or P3 have already arrived at the second or third programmed state P2 or P3. Thus, the memory cells that become ON-cells when the first read voltage Vrd1 is applied thereto are only the memory cells conditioned in the erased state E.

Comparing FIG. 4A to FIG. 4B, it can be seen that the number of ON-cells will change between the program-verify and read operations even while reading the first programmed state P1. In other words, the program-verify operation is associated with a larger threshold voltage distribution than the read operation for the given number of ON-cells. This difference in the number of ON-cells between the program-verify and read operations arises from the fact that there are memory cells, threshold voltages of which have not yet reached the first program-verify voltage Vvf1, among the memory cells to be programmed into the second or third programmed states P2 or P3.

Figure 5A:
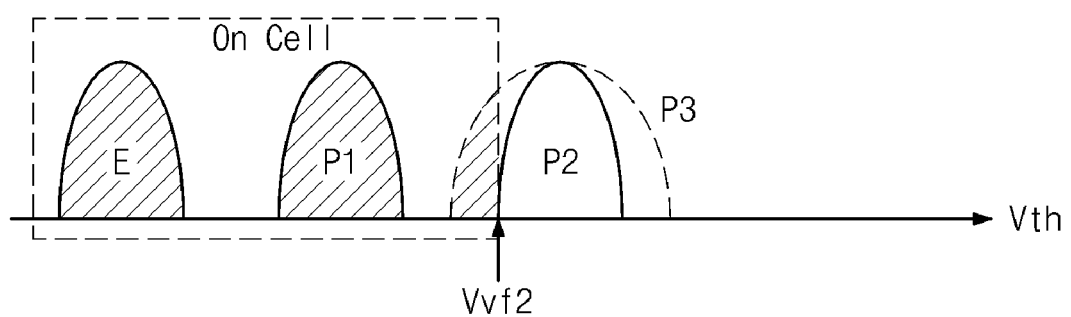
FIGS. 5A and 5B are diagrams showing exemplary threshold voltage distributions for program-verify and read operations related to a second programmed state.
Figure 5B:
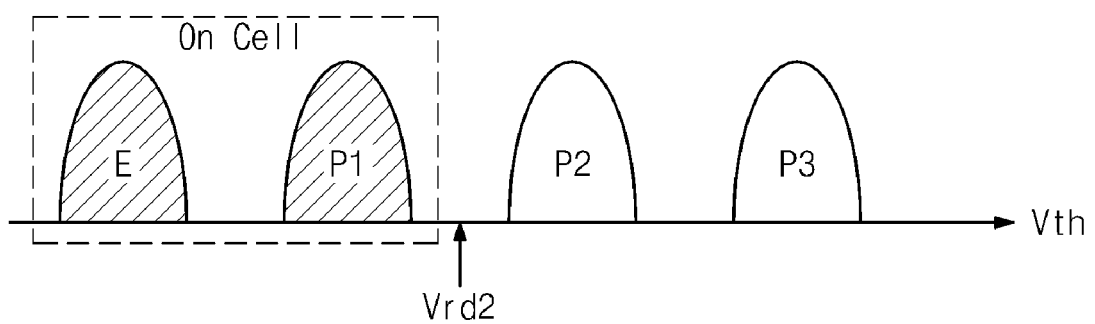

FIGS. 5A and 5B show threshold voltage distributions for the program-verify operation for programming selected memory cells into the second programmed state P2, and threshold voltage distributions in the read operation for reading selected memory cells of the second programmed state P2.

FIG. 5A is a diagram showing threshold voltage distributions for ON-cells when the second program-verify voltage Vvf2 is applied to the selected memory cells. The ON-cells identified by the second program-verify voltage Vvf2 include memory cells conditioned in the erased state E and the first programmed state P1, and memory cells having threshold voltages of which have not yet reached the second program-verify voltage Vvf2 among the memory cells to be programmed into the third programmed state P3.

FIG. 5B shows threshold voltage distributions ON-cells when the second read voltage Vrd2 is applied to the selected word line. Referring to FIG. 5B, the ON-cells identified by the second read voltage Vrd2 correspond to memory cells conditioned in the erased state E and the first programmed state P1. This is because memory cells to be programmed into the third programmed state P3 have already reached the third programmed state P3.

Comparing FIG. 5A to FIG. 5B, it can be seen that the number of ON-cells will change as between the program-verify and read operations, even while reading the second programmed state P2. In other words, the program-verify operation is associated with a larger threshold voltage distribution than the read operation for a given number of ON-cells. This difference in the number of ON-cells between the program-verify and read operations arises from the fact that there are memory cells having threshold voltages which have not yet reached the second program-verify voltage Vvf2 among the memory cells to be programmed into the third programmed states P3.

Figure 6A:
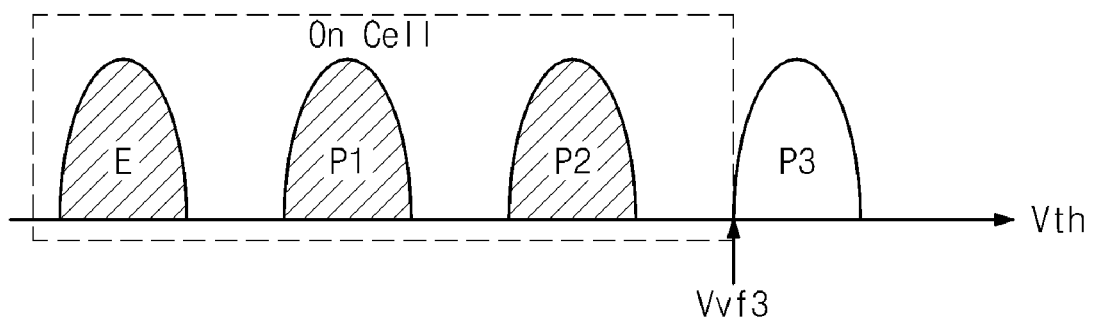
FIGS. 6A and 6B are diagrams showing exemplary threshold voltage distributions for program-verify and read operations related to a third programmed state.
Figure 6B:
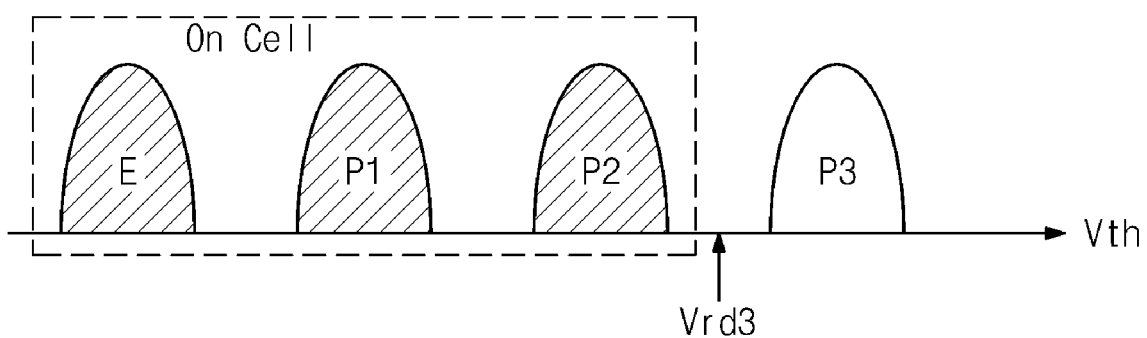

FIGS. 6A and 6B are diagrams showing threshold voltage distributions in the program-verify operation for programming selected memory cells into the third programmed state P3, and threshold voltage distributions in the read operation for reading selected memory cells of the third programmed state P3.

FIG. 6A shows threshold voltage distributions for ON-cells when the third program-verify voltage Vvf3 is applied to the selected memory cells. The ON-cells identified by the third program-verify voltage Vvf3 include memory cells conditioned in the erased state E, and the first and second programmed states P1 and P2. FIG. 6B shows threshold voltage distributions for ON-cells when the third read voltage Vrd3 is applied to the selected word line. Referring to FIG. 6B, the ON-cells identified by the third read voltage Vrd3 correspond to memory cells conditioned in the erased state E, and the first and second programmed states P1 and P2.

Comparing FIG. 6A with FIG. 6B, it can be seen that the number of ON-cells is the same for the program-verify and read operations when reading the third programmed state P3. This is because the memory cells to be programmed to the third programmed state P3 have already reached the third program-verify voltage Vvf3.

As illustrated in FIGS. 4A through 6B, the program-verify operation for programming the selected memory cells into the state P1 or P2 may be even different from the read operation for sensing the state P1 or P2 in the number of ON-cells. If the number of ON-cells changes between the program-verify and read operations for the same state, the CSL voltage $V_{CSL}$ varies as described above. And if the CSL voltage $V_{CSL}$ varies, it may broaden the width of a threshold voltage distribution. This result will be described in some additional detail with reference to FIG. 8.

Figure 7:
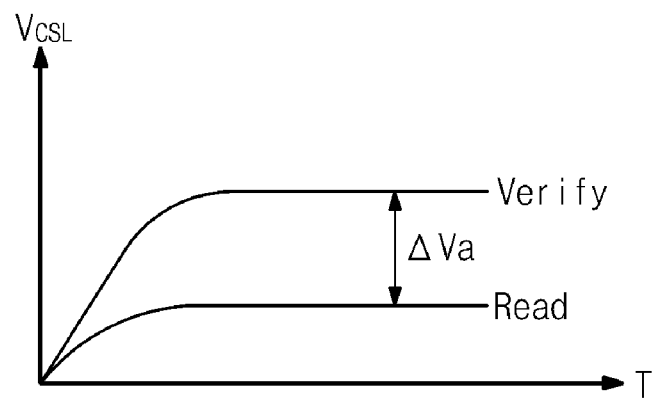
FIG. 7 is a graphic diagram showing a CSL voltage during program-verify and read operations.

FIG. 7 is a graphic diagram showing the CSL voltage $V_{CSL}$ during the program-verify and read operations. In the graph of FIG. 7, the horizontal axis indicates time T while the vertical axis indicates the level of the CSL voltage $V_{CSL}$. FIG. 7 shows exemplary voltage levels for the CSL voltage $V_{CSL}$.

Referring to FIG. 7, since the number of ON-cells changes between the program-verify and read operations as described above in relation to FIGS. 4A through 6B, the CSL voltage $V_{CSL}$ may also vary. In other words, the CSL voltage $V_{CSL}$ varies according to a difference "ΔVa" between the program-verify and read operations in which the first program-verify voltage Vvf1 and the first read voltage Vrd1 respectively are applied to the selected memory cells. This may also be the case when applying the second program-verify voltage Vvf2 and the second read voltage Vrd2.

Figure 8:
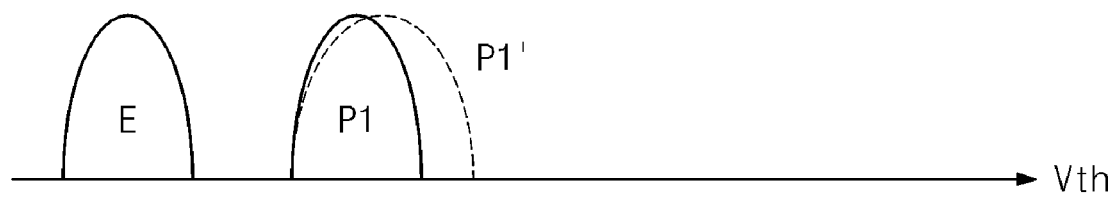
FIG. 8 is a diagram showing variation (broadening) of a threshold voltage distribution due to a difference in the CSL voltage between program-verify and read operations.

FIG. 8 is a diagram showing an exemplary variation of a threshold voltage distribution due to a difference in the CSL voltage between the program-verify and read operations. While FIG. 8 simply illustrates the first programmed state P1, a threshold voltage distribution may also similarly change for the second programmed state P2.

As noted above, the number of ON-cells may be greater during a program-verify operation than during a corresponding read operation. If the number of ON-cells increases during the program-verify operation, the amount of current flowing through the common source line CSL increases, and with the increasing current flow through the common source line CSL, the voltage level on the common source line CSL rises. If the CSL voltage increases, the threshold voltage distribution of the memory cells broadens as illustrated by the dotted line P1' shown in FIG. 8.

Figure 9:
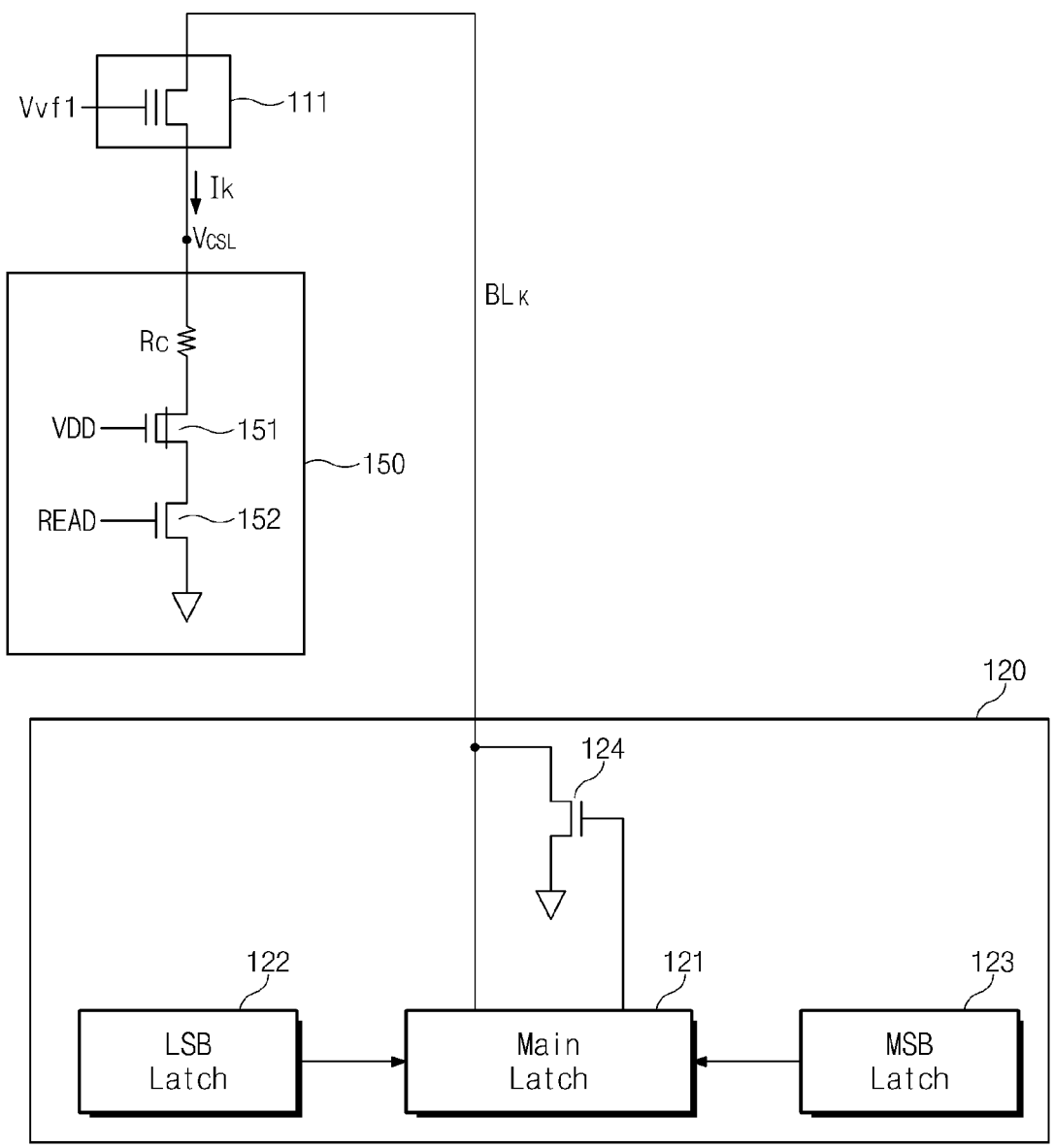
FIG. 9 is a schematic circuit diagram further illustrating the data input/output circuit of FIG. 1.

FIG. 9 is a schematic circuit diagram further illustrating the data input/output circuit 120 of FIG. 1. Referring to FIG. 9, the data input/output circuit 120 comprises; a main latch circuit 121, a data latch circuit of LSB and MSB latches 122 and 123, and a discharge circuit 124. Here, the number of the data latch circuits may vary in accordance with the number of data bits stored in a memory cell. For instance, if one memory cell stores 2-bit data, the data latch circuit is formed of the LSB and MSB latches 122 and 123 as shown in FIG. 9.

The main latch circuit 121 is connected to an arbitrary the bit line BLk, storing a result of the program-verification. Exemplarily, if a programmed result is verified as program-pass, the main latch circuit 121 changes its data into pass data (or data '1'). If a programmed result is verified as program-fail, the main latch circuit 121 maintains program data (or data '0').

The main latch circuit 121 controls the discharge circuit 124 in accordance with data stored in the LSB and MSB latches 122 and 123 during the program-verify operation. In other words, the main latch circuit 121 controls the CSL voltage by discharging the bit line BLk in the program-verify operation.

For example, in the case of the program-verify operation for the first programmed state P1 while the data latch circuit is storing data correspondent to the second and third programmed states P2 and P3, the main latch circuit 121 discharges the bit line BLk. And, in the case of the program-verify operation for the second programmed state P2 while the data latch circuit is storing data correspondent to the third programmed state P3, the main latch circuit 121 discharges the bit line BLk.

The LSB latch 122 is provided for storing LSB data and the MSB latch 123 is provided for storing MSB data. The LSB and MSB latches 122 and 123 maintain LSB and MSB data respectively in the program-verify operation. That is, the LSB and MSB latches 122 and 123 operate to retain multi-bit data until the programming operation is terminated.

The discharge circuit 124 operates to discharge the bit line BLk under control by the main latch circuit 121 in the program-verify operation. The discharge circuit 124 may be implemented simply by an NMOS transistor. When the NMOS transistor of the discharge circuit 124 is turned on, the bit line BLk is discharged to the ground voltage.

Figure 10A:
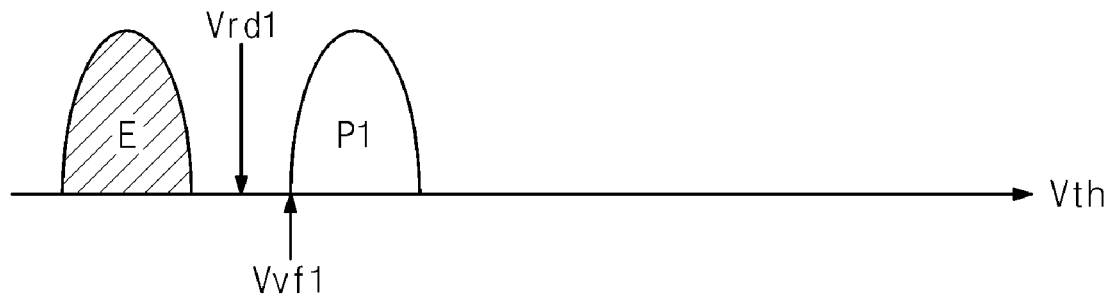
FIGS. 10A, 10B, and 10C are diagrams showing threshold voltage distributions for program-verify and read operations related to the first through third programmed states.
Figure 10B:
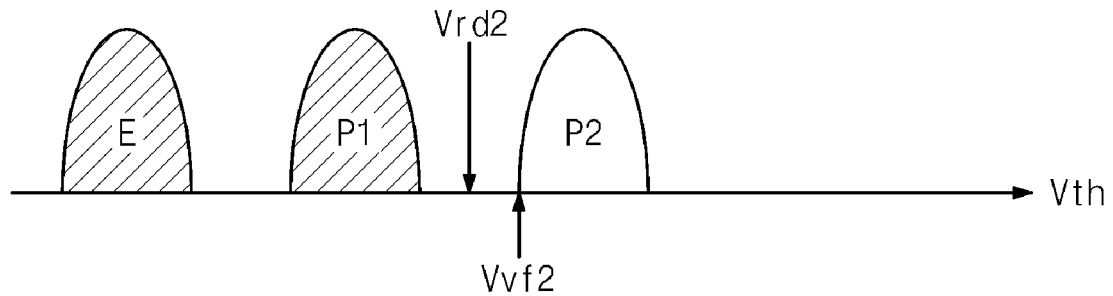
Figure 10C:
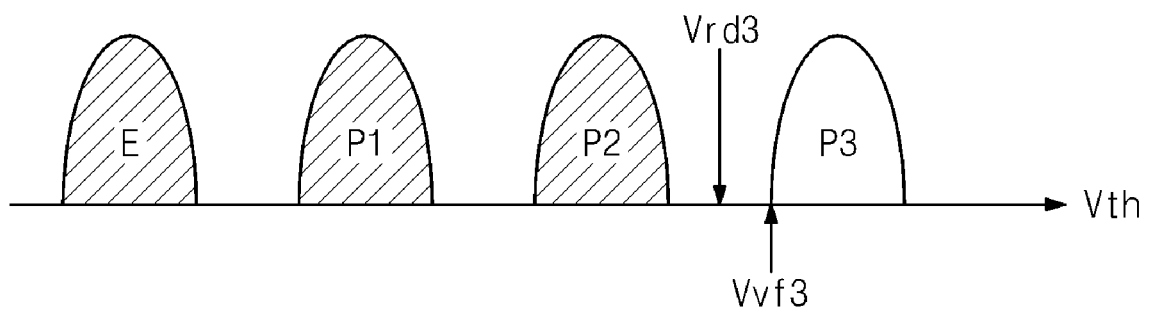

FIGS. 10A, 10B, and 10C are diagrams showing threshold voltage distributions during program-verify and read operations for the first through third programmed states P1, P2, and P3. FIG. 10A shows distributions of ON-cells when the first program-verify voltage Vvf1 and the first read voltage Vrd1 are applied to the selected word line. In FIG. 10A, the hatched region corresponds to the ON-cells. FIG. 10B shows distributions of ON-cells when the second program-verify voltage Vvf2 and the second read voltage Vrd2 are applied to the selected word line. FIG. 10C shows distributions of ON-cells when the third program-verify voltage Vvf3 and the third read voltage Vrd3 are applied to the selected word line. From FIGS. 10A through 10C, it can be seen that the number of ON-cells is equal as between the program-verify and read operations.

The flash memory device according to embodiments of the invention operates to discharge a bit line in accordance with program data stored in the data input/output circuit during the program-verify operation, thereby reducing a potential difference in the amount of current flowing through the common source line CSL, as between the program-verify and read operations. Accordingly, embodiments of the invention are effective in reducing the potential voltage difference apparent on the CSL voltage as between the program-verify and read operations.

Figure 11:
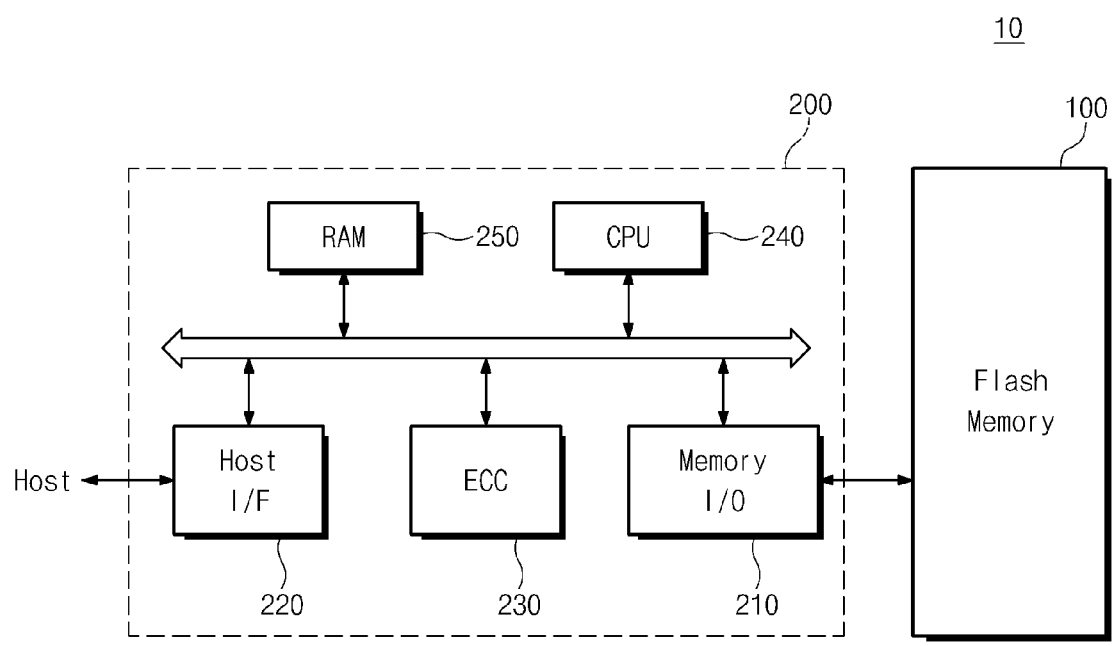
FIG. 11 is an exemplary block diagram of a semiconductor memory system according to an embodiment of the invention.

FIG. 11 is an exemplary block diagram of a semiconductor memory system according an embodiment of the invention. Referring to FIG. 11, the semiconductor memory system 10 comprises; the flash memory device 100 and a memory controller 200. The flash memory device 100 may be like the embodiments described above, and program, read, and erase operations are controlled by the memory controller 200.

The memory controller 200 provides a read command RD_CMD, an address ADDR, and a control signal CTRL to the flash memory device 100 in the read operation. The flash memory device 100 receives the read command and address from the memory controller 200 and provides a read voltage to a corresponding word line.

The memory controller 200 includes a memory interface 210, a host interface 220, an error check/correction (ECC) circuit 230, a central processing unit (CPU) 240, and a random access memory (RAM) 250. The RAM 250 is used as a working memory of the CPU 240. The host interface 220 is compatible with a data communication protocol necessary for exchanging data with a host.

The ECC circuit 230 is used for analyzing and correcting bit errors of data stored in the flash memory device 100. The memory interface 210 is directly connected with the flash memory device 100, being used for mediating a command, an address, data, and a control signal between the flash memory device 100 and a host. The CPU 240 conducts general operations for data exchange of the memory controller 200. Although not shown, it can be understood by those skilled in the art that the semiconductor memory system 10 may be further comprised of a read-only memory (ROM) storing code data for interface with a host.

Figure 12:
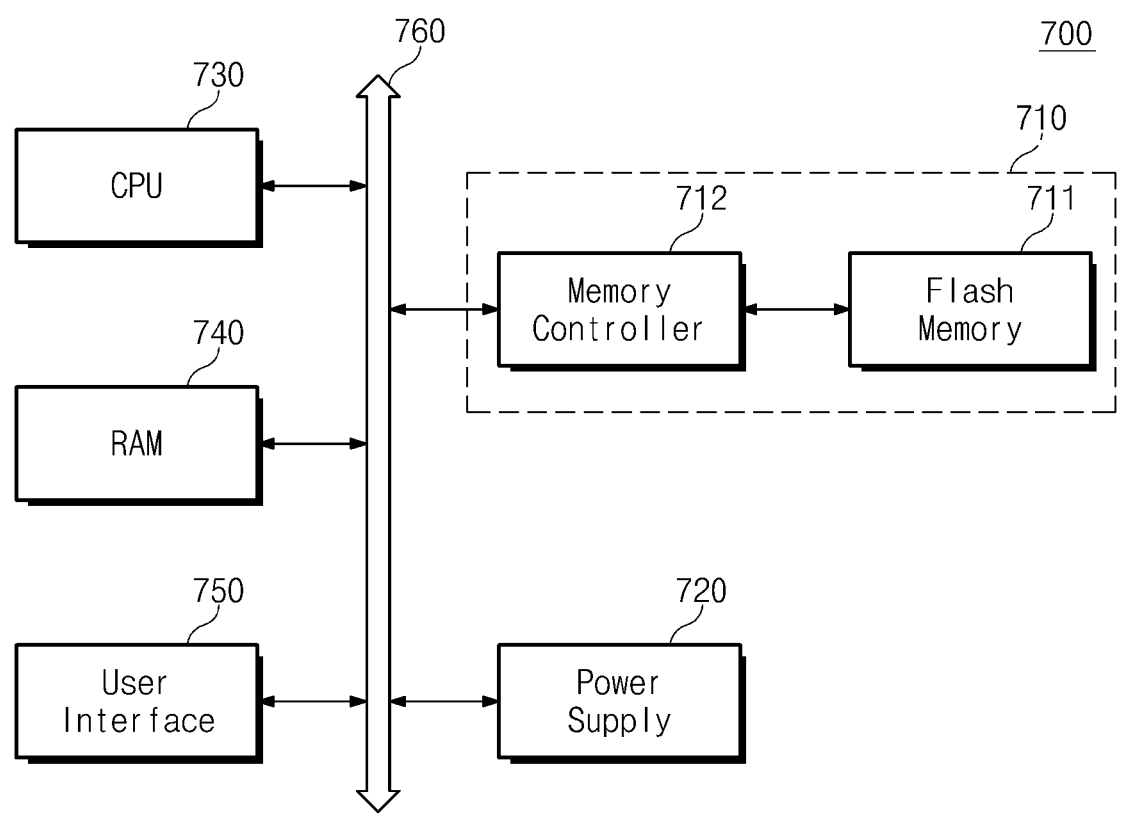
FIG. 12 is a block diagram of a computing system incorporating a semiconductor memory system according to an embodiment of the invention.

FIG. 12 is a block diagram of a computing system with a semiconductor memory system according to an embodiment of the invention. Referring to FIG. 12, the memory system 700 includes a semiconductor memory system 710, a power supply unit 720, a CPU 730, a RAM 740, a user interface 750, and a system bus 760.

The semiconductor memory system 710 includes a flash memory 711 and a memory controller 712. The semiconductor memory system 710 may be designed by employing a unit product of the flash memory or an integrated circuit such as oneNAND™ memory. The flash memory 711 inputs a read command and an address from the memory controller 712, analyzes an error correction code (ECC), and controls the selected read voltage Vrd and the deselected read voltage Vread in level.

The semiconductor memory system 710 is electrically connected to the power supply unit 720, the CPU 730, the RAM 740, and the user interface 750 through the system bus 760. The flash memory 711 stores data, which are provided through the user interface 750 or processed by the CPU 730, by way of the memory controller 712.

If the semiconductor memory system 710 is built in a semiconductor solid state disk (SSD), a booting rate of the computing system 700 can be greatly enhanced. Although not shown, the computing system shown in FIG. 12 may be used in an application chipset, a camera image processor, or so forth.

The memory system may be mounted by way of various types of packages. For instance, the flash memory device and/or the memory controller may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
   a plurality of memory cells connected between a bit line and a common source line; and
   a data input/output circuit connected to the bit line and storing program data in a selected one of the plural memory cells,
   wherein the data input/output circuit maintains the program data during a program-verifying operation and controls a voltage level of the bit line in accordance with the program data, and
   wherein the data input/output circuit controls a voltage level of the common source line by discharging the bit line in accordance with the program data during the program-verifying operation.

2. The flash memory device of claim 1, wherein the memory cell is a multi-level cell.

3. The flash memory device of claim 1, wherein the data input/output circuit comprises:
   a main latch storing a result of the program-verifying operation; and
   a data latch maintaining the program data.

4. The flash memory device of claim 3, wherein the data latch maintains the program data until a programming operation is terminated.

5. The flash memory device of claim 3, wherein the data input/output circuit further comprises a discharge circuit discharging the bit line during the program-verifying operation.

6. The flash memory device of claim 5, wherein the discharge circuit is connected to the bit line and configured in a metal-oxide-semiconductor transistor.

7. The flash memory device of claim 5, wherein the data input/output circuit discharges the bit line while storing program data conditioned in a state higher than a state to be program-verified.

8. The flash memory device of claim 7, wherein an amount of current flowing through the common source line during the program-verifying operation is the same with an amount of current flowing through the common source line during a reading operation.

9. The flash memory device of claim 1, further comprising: a common source line driver connected between the common source line and a ground terminal.

10. A program-verifying method of a flash memory device having: a plurality of memory cells connected between a bit line and a common source line; and a data input/output circuit connected to the bit line, the method comprising:
storing program data, which is programmed in a selected one of the plural memory cells, into the data input/output circuit; and
programming the program data into the selected memory cell and conducting program-verification,
wherein the data input/output circuit maintains the program data during the program-verification and controls a voltage level of the bit line in accordance with the program data, and
wherein the data input/output circuit controls a voltage level of the common source line by discharging the bit line in accordance with the program data during the program-verification.

11. The method of claim 10, wherein the data input/output circuit maintains the program data until a programming operation is terminated.

12. The method of claim 11, wherein the data input/output circuit discharges the bit line while storing program data conditioned in a state higher than a state to be program-verified.

13. The method of claim 10, wherein an amount of current flowing through the common source line during the program-verification is the same with an amount of current flowing through the common source line during a reading operation.

14. A memory system comprising:
a flash memory device; and
a memory controller controlling the flash memory device,
wherein the flash memory device comprises:
a plurality of memory cells connected between a bit line and a common source line; and
a data input/output circuit connected to the bit line and storing program data in a selected one of the plural memory cells,
wherein the data input/output circuit maintains the program data during a program-verifying operation and controls a voltage level of the bit line in accordance with the program data, and
wherein the data input/output circuit controls a voltage level of the common source line by discharging the bit line in accordance with the program data during the program-verifying operation.

15. The memory system of claim 14, wherein the flash memory device and the memory controller are implemented in a memory card.

16. The memory system of claim 14, wherein the flash memory device and the memory controller are implemented in a solid state disk.

* * * * *